US009797592B2

(12) United States Patent
Marcus et al.

(10) Patent No.: US 9,797,592 B2
(45) Date of Patent: Oct. 24, 2017

(54) ILLUMINATED HOUSING FOR PORTABLE ELECTRONIC DEVICES

(71) Applicant: THE SELFIE STAND LLC, New York, NY (US)

(72) Inventors: Brian Marcus, New York, NY (US); Matthew Sommerfield, Allentown, PA (US)

(73) Assignee: THE SELFIE STAND LLC, New York, NY (US)

( * ) Notice: Subject to any disclaimer, the term of this patent is extended or adjusted under 35 U.S.C. 154(b) by 0 days.

(21) Appl. No.: 15/132,124

(22) Filed: Apr. 18, 2016

(65) Prior Publication Data

US 2016/0305646 A1  Oct. 20, 2016

Related U.S. Application Data

(60) Provisional application No. 62/149,262, filed on Apr. 17, 2015, provisional application No. 62/260,168, filed on Nov. 25, 2015.

(51) Int. Cl.
F21V 33/00 (2006.01)
F16M 11/24 (2006.01)
(Continued)

(52) U.S. Cl.
CPC .......... *F21V 33/0052* (2013.01); *A45C 11/00* (2013.01); *A47B 23/04* (2013.01); *A47B 23/06* (2013.01); *F16M 11/041* (2013.01); *F16M 11/245* (2013.01); *F16M 11/28* (2013.01); *F21L 4/02* (2013.01); *F21V 21/06* (2013.01);
(Continued)

(58) Field of Classification Search
CPC .... G03B 2215/0575; G03B 2215/0567; G03B 17/561; G03B 17/563; G03B 17/566; F16M 11/24; F16M 11/28; F16M 11/32; A45C 11/00; A45C 2011/002; A45C 2011/003; G06F 1/1626; G06F 1/1628;
(Continued)

(56) References Cited

U.S. PATENT DOCUMENTS 7,684,694 B2 * 3/2010 Fromm ................. F16M 11/14
396/376
7,706,673 B1 * 4/2010 Staudinger ......... F16M 11/2021
348/211.2
(Continued)

OTHER PUBLICATIONS

Webstar Usb-powered LED Ringlight for Webcams. Jul. 17, 2013. Web. Retrieved Mar. 15, 2017. <https://www.amazon.com/Webstar-Usb-powered-LED-Ringlight-Webcams/dp/B003TY0YP0>. Internet Archive. <https://web.archive.org/web/20130717031228/http://www.amazon.com/Webstar-Usb-powered-LED-Ringlight-Webcams/dp/B003TY0YP0>.*
(Continued)

*Primary Examiner* — Suezu Ellis
(74) *Attorney, Agent, or Firm* — Holtz, Holtz & Volek PC

(57) ABSTRACT

A device includes a housing with a recessed area and a raised peripheral section surrounding the recessed area, wherein the recessed area is recessed with respect to the raised peripheral section. A gripping mechanism is provided in the recessed area. The gripping mechanism is adjustable to hold portable electronic devices of a plurality of different sizes. A light source is provided in the raised peripheral section, to emit light from the raised peripheral section.

20 Claims, 13 Drawing Sheets

(51) Int. Cl.

| | |
|---|---|
| F16M 11/28 | (2006.01) |
| A45C 11/00 | (2006.01) |
| G06F 1/16 | (2006.01) |
| A47B 23/04 | (2006.01) |
| A47B 23/06 | (2006.01) |
| F16M 11/04 | (2006.01) |
| F21L 4/02 | (2006.01) |
| F21V 21/06 | (2006.01) |
| F21V 21/12 | (2006.01) |
| H05K 5/00 | (2006.01) |
| H05K 5/02 | (2006.01) |

(52) U.S. Cl.
CPC ........... *F21V 21/12* (2013.01); *H05K 5/0086* (2013.01); *H05K 5/0234* (2013.01); *H05K 5/0247* (2013.01); *A45C 2011/002* (2013.01); *A45C 2011/003* (2013.01); *A45C 2200/15* (2013.01); *G03B 2215/0514* (2013.01)

(58) Field of Classification Search
CPC ................... G06F 1/1656; G06F 1/166; G06F 2200/1633; B60R 11/0241; B60R 11/0252
USPC .......................................................... 362/11
See application file for complete search history.

(56) References Cited

U.S. PATENT DOCUMENTS

| | | | | |
|---|---|---|---|---|
| 2009/0003822 | A1* | 1/2009 | Tyner | F16M 11/32 396/428 |
| 2009/0161350 | A1* | 6/2009 | Sommers | A47F 3/001 362/126 |
| 2010/0001297 | A1* | 1/2010 | Takashima | H01L 33/60 257/88 |
| 2012/0044374 | A1* | 2/2012 | Pohlert | H04N 5/2256 348/220.1 |
| 2013/0201653 | A1* | 8/2013 | Shoemake | G03B 15/02 362/3 |
| 2013/0240587 | A1* | 9/2013 | Buchhalter | B60R 11/0241 224/570 |
| 2013/0301235 | A1* | 11/2013 | Harooni | G03B 15/02 362/11 |
| 2015/0055278 | A1* | 2/2015 | Baschnagel | H04M 1/04 361/679.01 |
| 2015/0276187 | A1* | 10/2015 | Shoemake | F21V 21/00 362/235 |
| 2016/0044227 | A1* | 2/2016 | Johnson | G03B 17/561 348/211.2 |
| 2016/0277660 | A1* | 9/2016 | Kaiser | G03B 17/38 |
| 2016/0309009 | A1* | 10/2016 | Haskell | H04M 1/04 |

OTHER PUBLICATIONS

Stellar Lighting Systems Original Diva CEL 18 CFL Compact Fluorescent Ring Light. Jan. 1, 2015. Web. Retrieved Mar. 17, 2017. Internet Archive. <http://web.archive.org/web/20150112025535/ http://www.stellarlightingsystems.com/original-diva-cel-r18c-18-fluorescent-ring-light-with-dimmer-softener-7f-stellar-stand-shotgun-microphone>.*

* cited by examiner

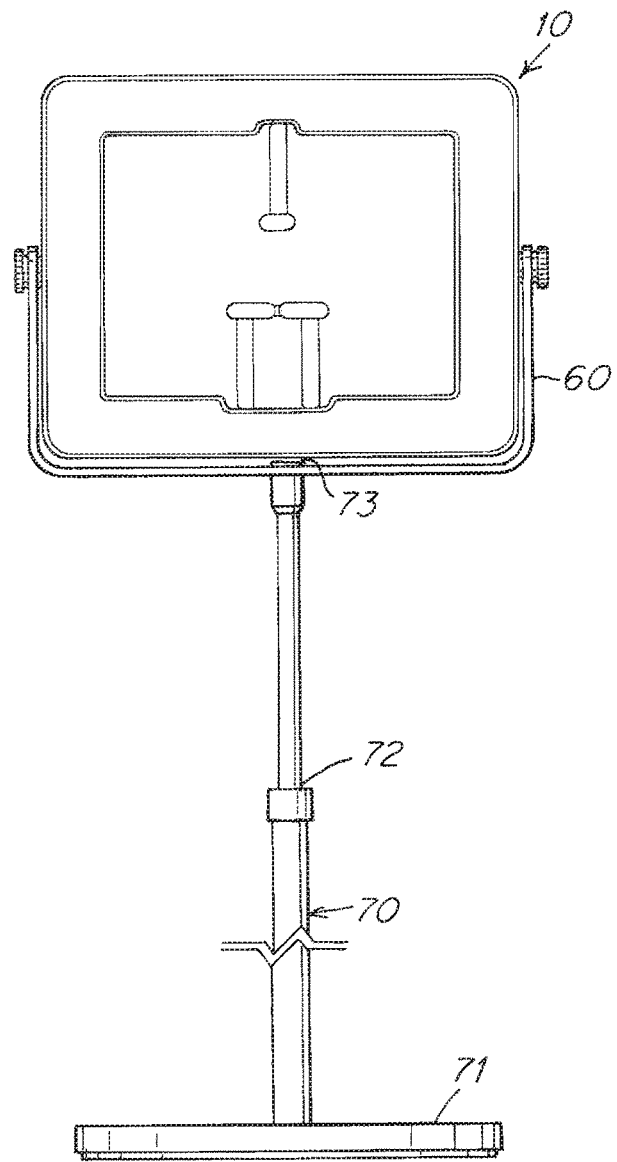
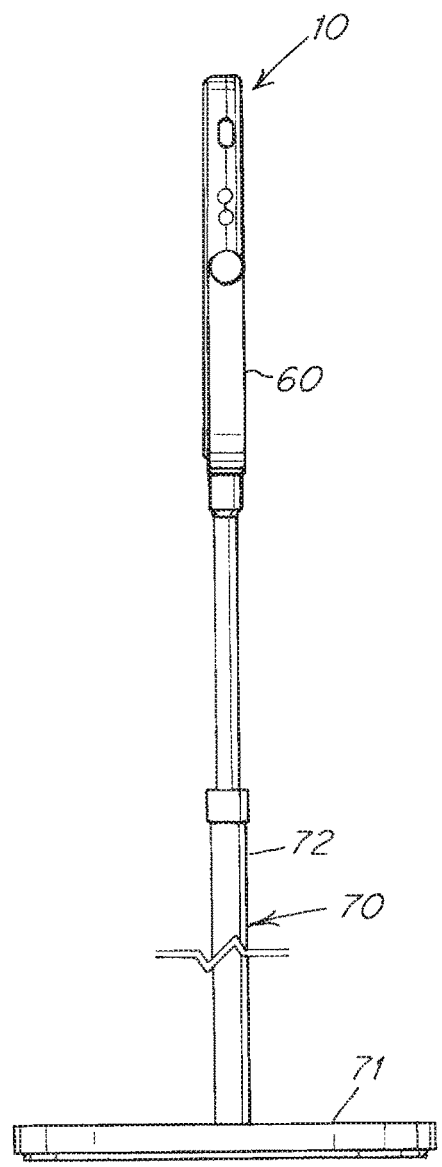
Fig. 9A
Fig. 9B

ILLUMINATED HOUSING FOR PORTABLE ELECTRONIC DEVICES

FIELD OF THE INVENTION

The invention relates to an illuminated housing which can hold a variety of portable electronic devices.

SUMMARY OF THE INVENTION

According to one aspect of the invention, a device includes a housing which has a recessed area and a raised peripheral section provided around the recessed area, wherein the recessed area is recessed with respect to the raised peripheral section. A gripping mechanism is provided in the recessed area. The gripping mechanism is adjustable to hold portable electronic devices of a plurality of different sizes. And a light source is provided in the raised peripheral section, to emit light from the raised peripheral section.

BRIEF DESCRIPTION OF THE DRAWINGS

FIGS. 9A, 9B, and 9C are front, side, and perspective views, respectively, of the device mounted on a stand;

DETAILED DESCRIPTION

Figure 1:
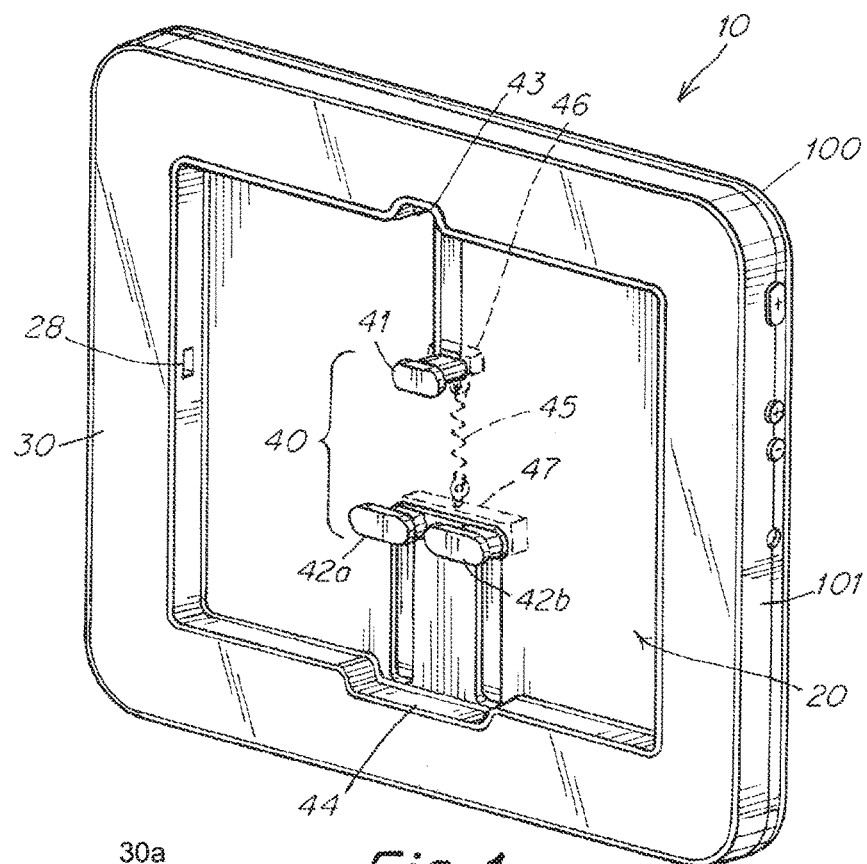
FIG. 1 is a perspective view of a device according to an embodiment of the invention.

FIG. 1 illustrates device 10 according to one embodiment of the invention. The device 10 has a housing 100 (for example, Width: 14.0 inches; Height: 11.00 inches and Thickness: 1.14 inches) provided with a recessed area 20 which is recessed with respect to a raised peripheral section 30. The recessed area 20 is preferably sized (Width: A and Height: C) to accommodate a variety of portable electronic devices, in particular smartphones and tablet computers (for example, A=10.40 inches and C=7.43 inches).

Figure 2:
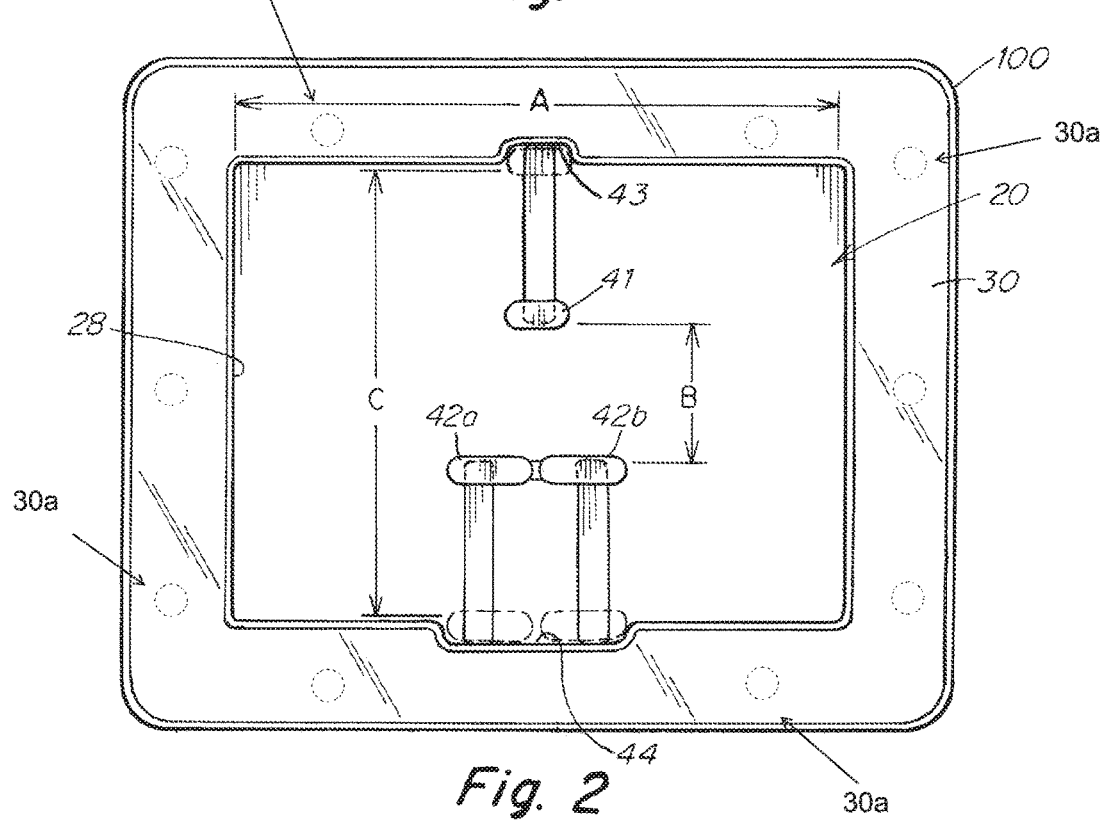
FIG. 2 is a front view of the device.

Inside the recessed area, an adjustable gripping mechanism 40 is provided. In the illustrated embodiment, the gripping mechanism includes an upper section with one upper grip 41 and a lower section with two lower grips 42a and 42b. As shown in FIG. 2, the upper grip 41 is movable from a position near the center of the recessed area 20 to a position at the top of the recessed area, and the lower grips 42a and 42b are movable from a position near the center of the recessed area to a position at the bottom of the recessed area. In this way, the grips are adjustable to receive and hold the variety of portable electronic devices (particularly smartphones and tablet computers) that can be received in the recessed areas. Preferably, the grips should be adjustable over a sufficiently large range to receive and hold both smartphones and tablet computers (for example, 2.25 inches to 7.43 inches). The grips 41, 42a, and 42b may be provided with a friction member to better hold portable electronic devices. For example, the grips may be coated with rubber, or rubber members may be adhered to the grips 41, 42a, and 42b at positions where the rubber members will contact devices held in the grips.

The gripping mechanism includes a biasing mechanism, such as a spring 45, inside the housing 100 and behind the surface of recessed area 20 (see FIG. 1) to bias the upper and lower grips towards each other. The grip 41 has an arm 46 extending rearward behind the surface of recessed area 20 that engages an end of the spring 45. The grips 42a and 42b have an arm 47 extending rearward and engaging the other end of spring 45. Spring 45 biases the grips toward each other.

Figure 11:
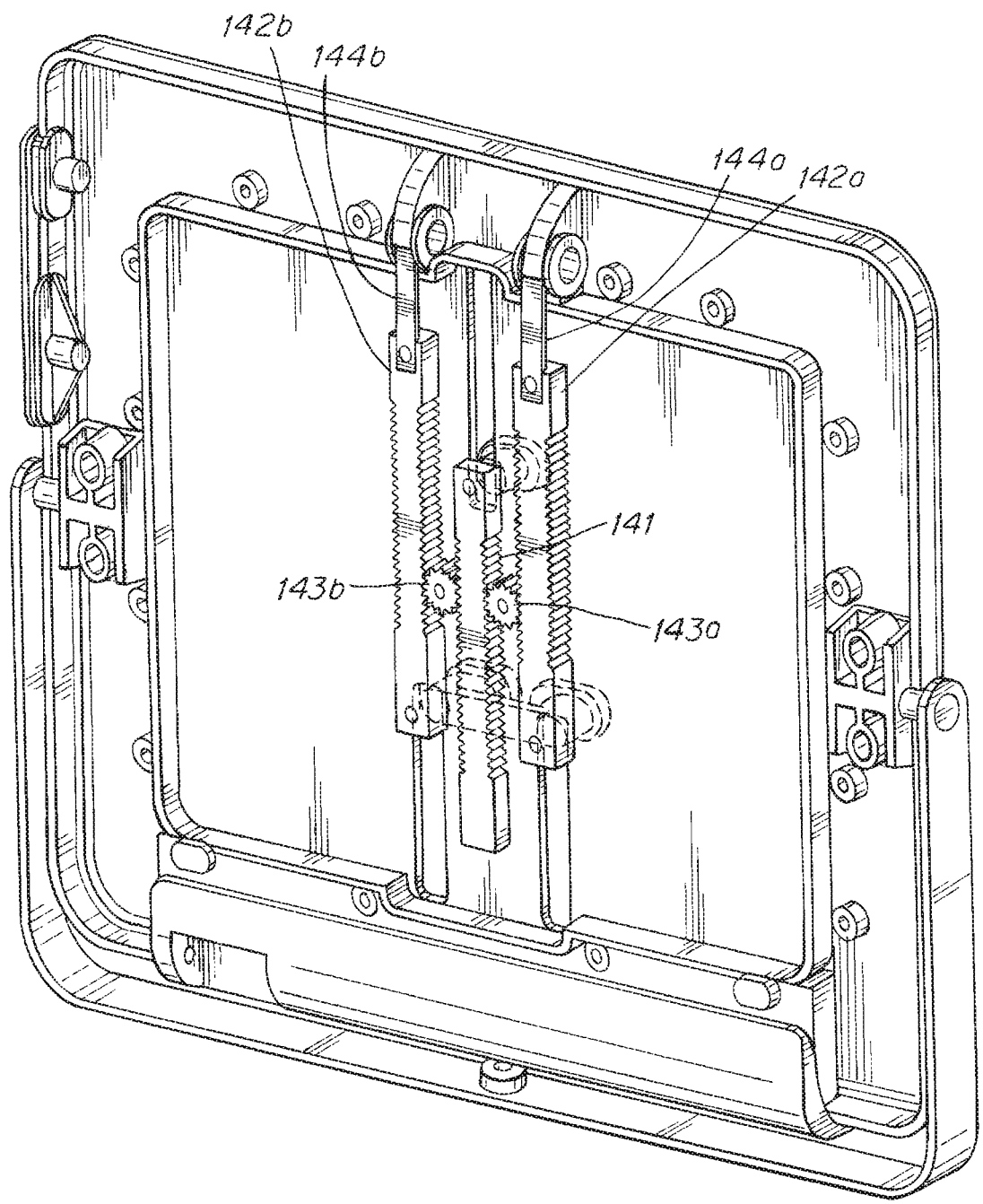
FIG. 11 shows an alternative structure for a gripping mechanism.

Alternatively, shown in FIG. 11 the upper grip 41 and the lower grips 42a and 42b may be coupled to each other by a rack and pinion mechanism, so that movement of the upper grip also causes movement of the lower grips, and movement of the lower grips causes movement of the upper grip. The rack and pinion mechanism also causes the upper grip and the lower grips to move symmetrically with respect to each other, so that movement of the upper grip by a certain amount causes an equal movement of the lower grips, and so that movement of the lower grips by a certain amount causes an equal movement by the upper grip. In the example shown in FIG. 11, one rack 141 is coupled to the upper grip 41, two racks 142a and 142b are coupled to the lower grips 42a and 42b, and pinions 143a and 143b are provided between racks 142a and 141 and between racks 141 and 142b. Springs 144a and 144b are coupled between the racks 142a and 142b and the interior of the housing of the device, to bias the upper and lower grips toward each other. As illustrated, the springs 144a and 144b are constant force springs. However, variable force springs could also be used, if it is desired to apply greater force when larger portable electronic devices are held by the grips.

In addition, as shown in FIG. 2 for example, in the illustrated embodiment the raised peripheral section 30 has a recess 43 to at least partially receive upper grip 41 when the upper grip 41 is at its uppermost position, and a recess 44 to at least partially receive lower grips 42a and 42b when the lower grips 42a and 42b are at their lowest position. In the illustrated embodiment the raised peripheral portion completely surrounds the recess, but the raised peripheral portion may partially surround the recess.

The raised peripheral section 30 includes at least one light emitting element therein. For example, the raised peripheral section 30 may include LEDs 30a covered by a translucent cover comprising at least part of the front surface of raised peripheral section 30, such that the raised peripheral section 30 has an illuminated (light-emitting) surface. The translucent cover can be made from acrylic (Poly(methyl methacrylate) (PMMA)). The translucent cover is at least part of the raised peripheral section 30 and may be textured to diffuse light emitted by the LEDs. In addition, or alternatively, a translucent coating, such as a translucent white coating of paint or ink, may be applied to a surface (such as the rear surface) of the cover. By providing the coating to the rear surface, light in the translucent cover is more effectively directed outward from the front surface of the cover. For a similar reason, it may be desired to polish side surfaces of the translucent cover to make the side surfaces reflective.

In one embodiment, light is emitted from the entire front translucent surface of the raised peripheral section 30, around the entire periphery of the recessed area 20. Alternatively, light may be emitted only from one or more side portions of the front surface, such as the left and right side portions, or the upper and lower side portions. In this case, the translucent cover need only be provided where light is emitted, and the front surface of the device is not required to be translucent where light is not emitted.

Figure 3:
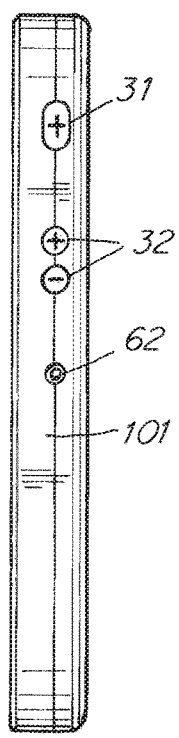
FIG. 3 is a side view of the device.

As shown in FIG. 3, a power button switch 31 for turning light emission on and off can be provided on, for example, a side surface 101 of the housing 100. As also shown in FIG. 3, dimmer buttons 32 can be provided to allow a user to control the brightness of light emitted from the raised peripheral section 30.

Figure 4:
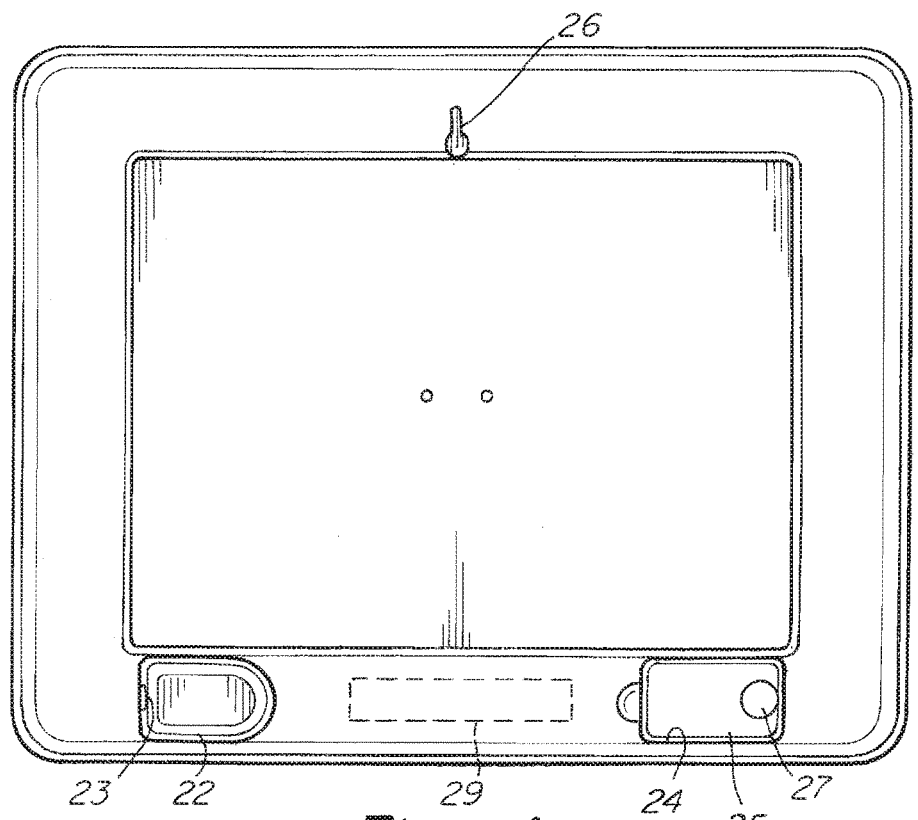
FIG. 4 is a rear view of the device.
Figure 7A:
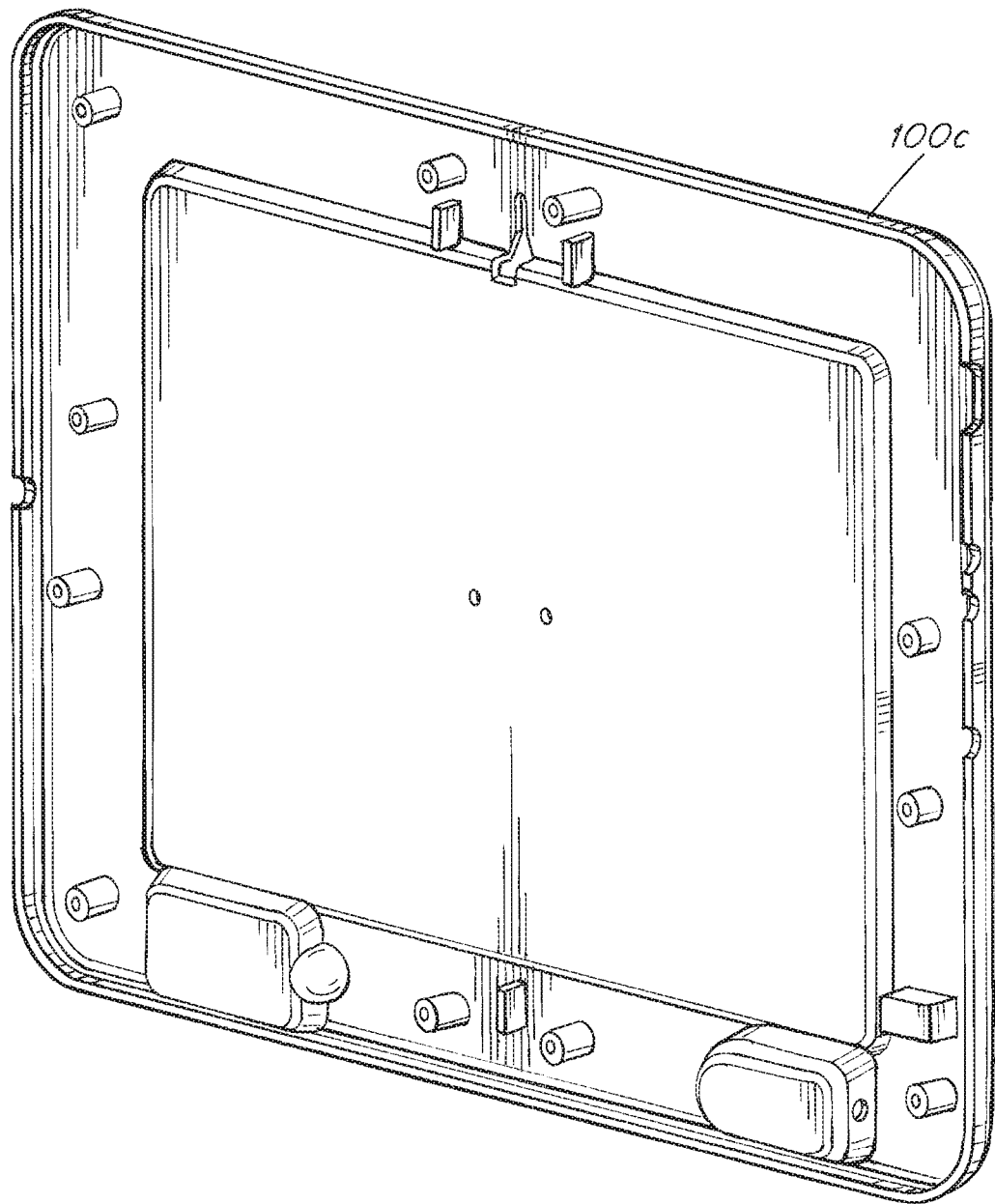
FIGS. 7A and 7B are front and rear perspective views, respectively, of a rear cover of the device.
Figure 7B:
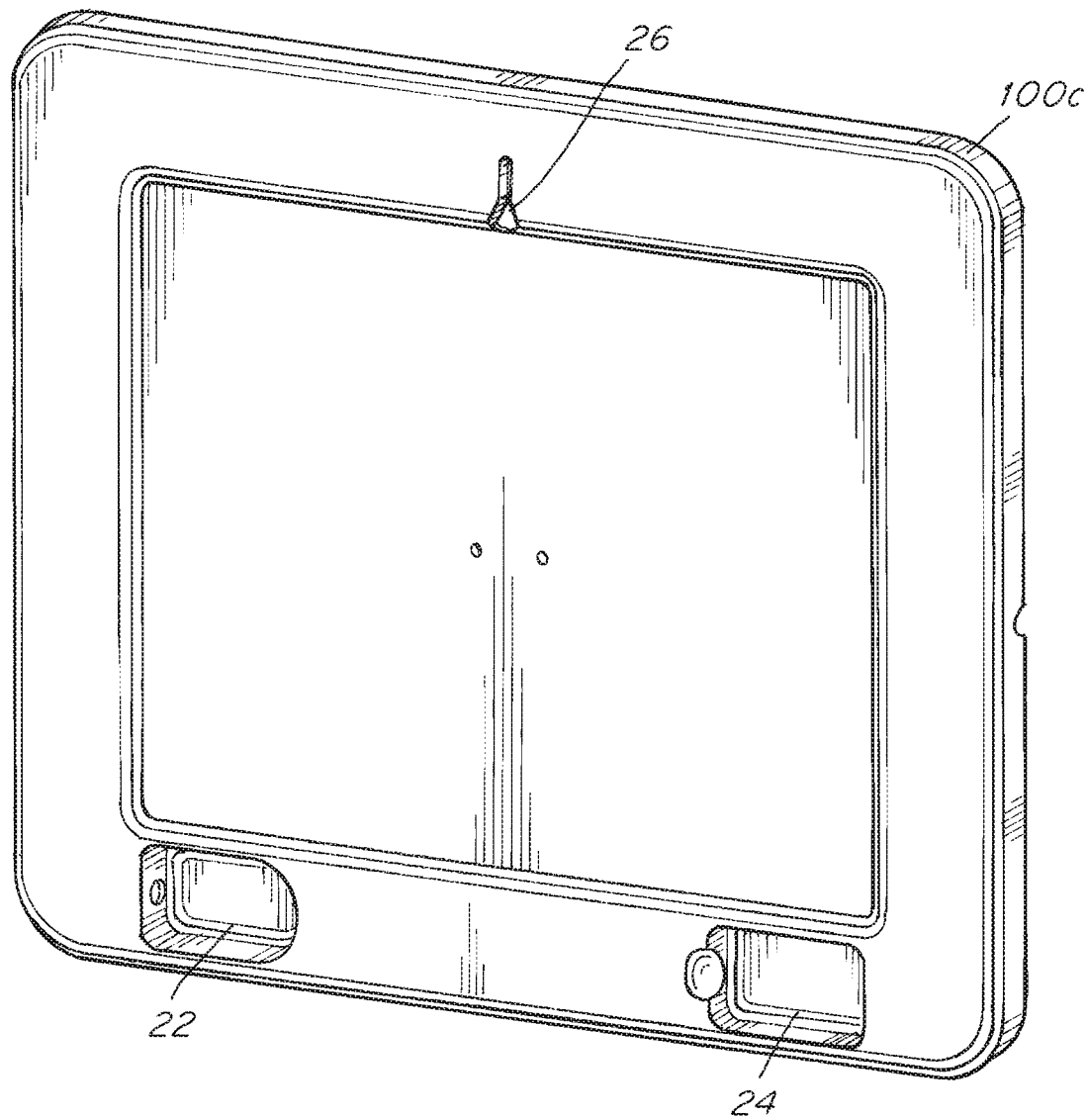

As shown in FIGS. 4 and 7B, the rear of the housing 100 can have a recess 22 in which a power input 23 is provided. The housing 100 may also house a rechargeable battery 29 as shown in broken lines in FIG. 4. The device may be provided with a voltage boost circuit, to allow the device to be powered by a variety of batteries, including alkaline, nickel-cadmium, and lithium-ion polymer batteries. The voltage boost circuit allows the device to maintain a consistent light output with different power sources. In a side wall of the recess 20 at the front side of the housing 100, a device charging port 28 (e.g., a USB port) as shown in FIG. 1 can be provided, so that users can charge a portable electronic device held in the recess 20 by the gripping mechanism 40. The device 10 may also include a wireless (inductive) charging system, with an induction coil for charging positioned, for example, in the housing behind the central area of the recess 20. As also shown in FIGS. 4 and 7B, the rear of the housing 100 can have slot 26 that allows the housing 100 to be hung on a wall, for example.

In addition, the rear of the housing 100 can have a recess 24 to removably hold a remote control 25. The remote control 25 is configured to communicate with the portable electronic device received in the recess 20 and held by the gripping mechanism 40. For example, the remote control 25 and portable electronic device may communicate by short distance radio communication (e.g., BLUETOOTH®). In particular, the remote control 25 is configured to control the camera function of a portable electronic device such as a smartphone or tablet computer, to allow a user to instruct the portable electronic device to take a photograph. For example, the remote control can have a button 27 to serve as a shutter button for the camera function of the portable electronic device. The remote control 27 may be provided with additional control functions with respect to the illuminated device and the portable electronic device mounted in the housing. For example, the remote control could control lighting by the device, volume of sound output by the portable electronic device, or the playback of images, video or other media by the portable electronic device.

Figure 5A:
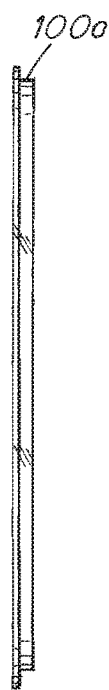
FIGS. 5A, 5B, and 5C are side, front, and perspective views, respectively, of a front panel of the device.
Figure 5B:
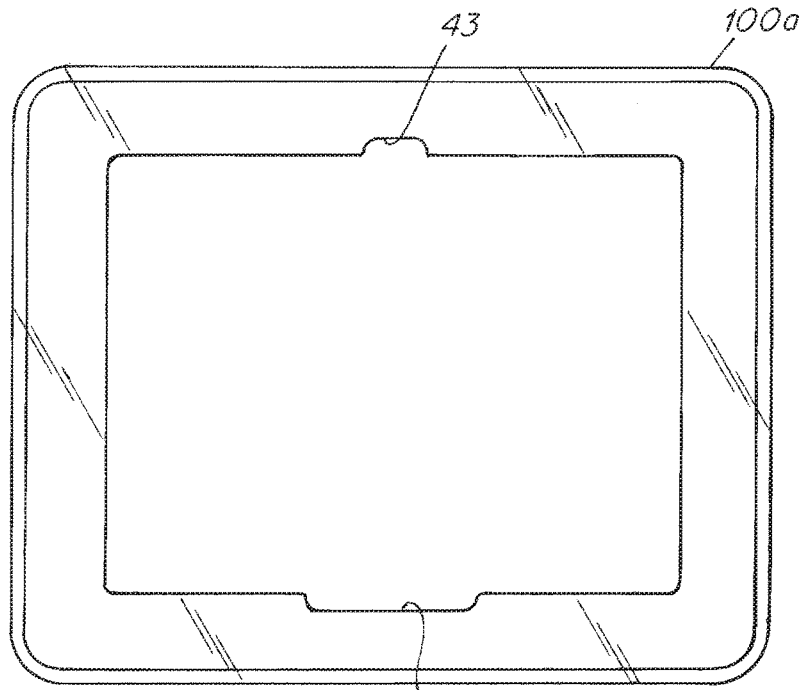
Figure 5C:
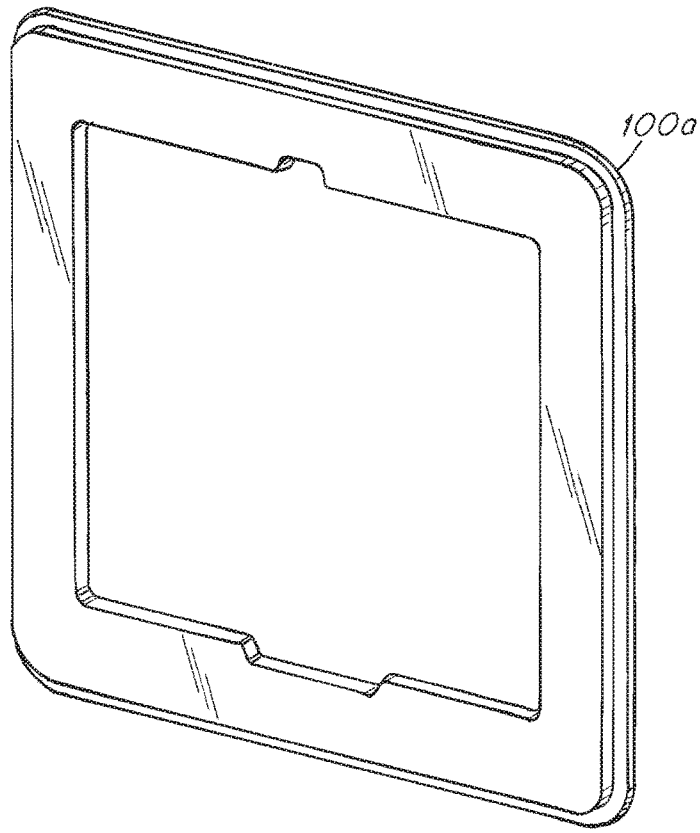
Figure 6A:
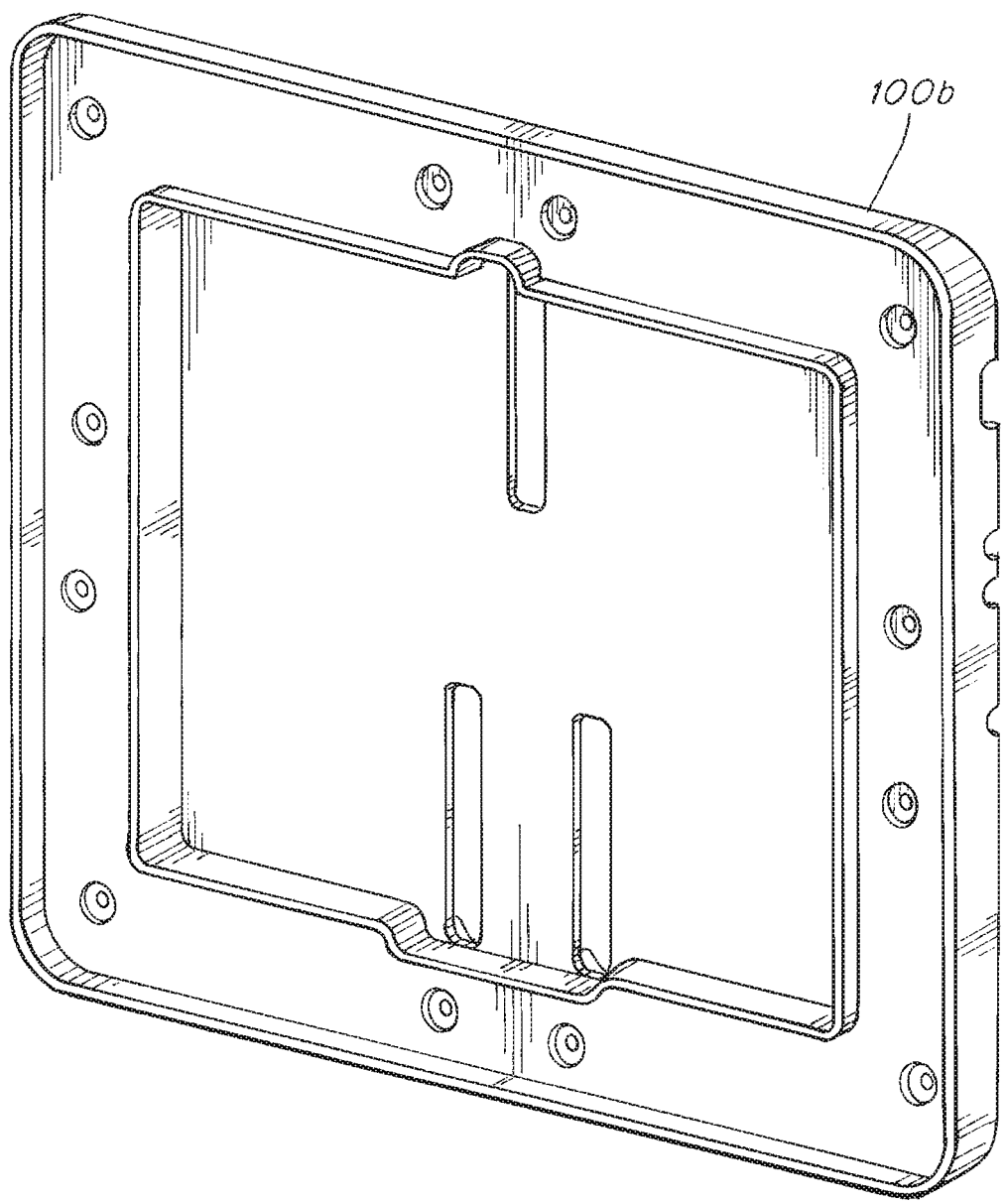
FIGS. 6A and 6B are front and rear perspective views, respectively, of a frame of the device.
Figure 6B:
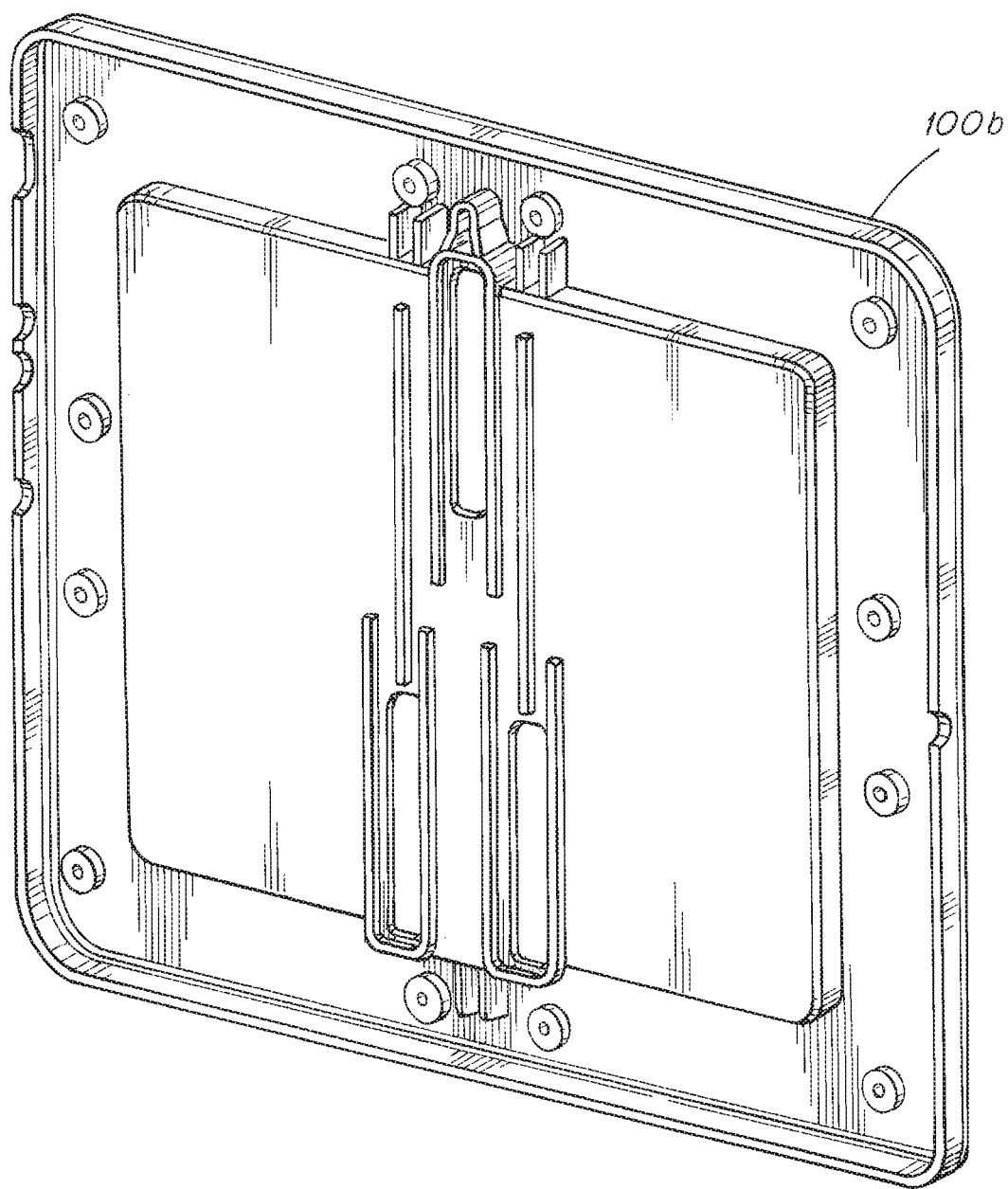

FIGS. 5A through 7B illustrate components of the housing 10. In this example, the housing 10 includes a frame 100b to support electrical and mechanical components of the device, front panel 100a mounted to a front side of the frame 100b, and a rear cover 100c mounted to a back side of the frame 100b. FIGS. 5A, 5B, and 5C are side, front, and perspective views, respectively, of the front panel 100a; FIGS. 6A and 6B are front and rear perspective views, respectively, of the frame 100b; and FIGS. 7A and 7B are front and rear perspective views, respectively, of the rear cover 100c.

Figure 8A:
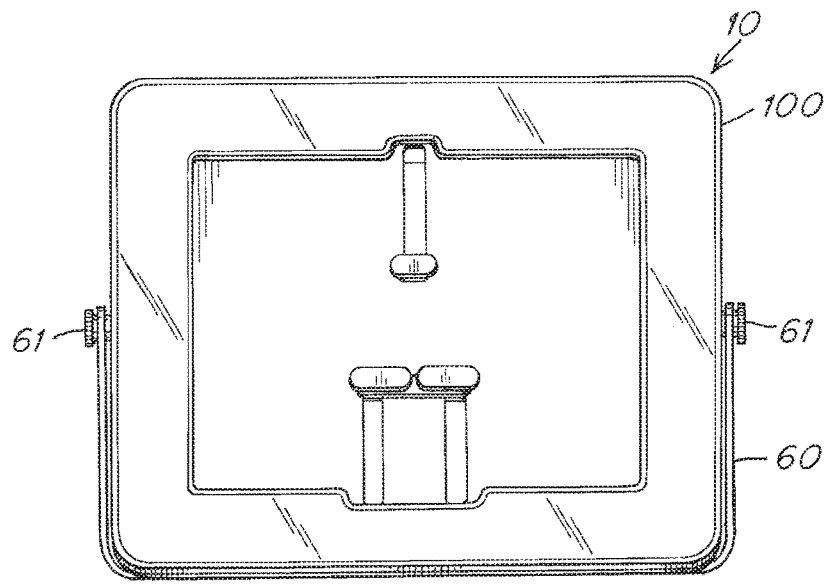
FIGS. 8A, 8B, and 8C are front, side, and perspective views, respectively, of the device with a tabletop stand attached.
Figures 8B, 8C:
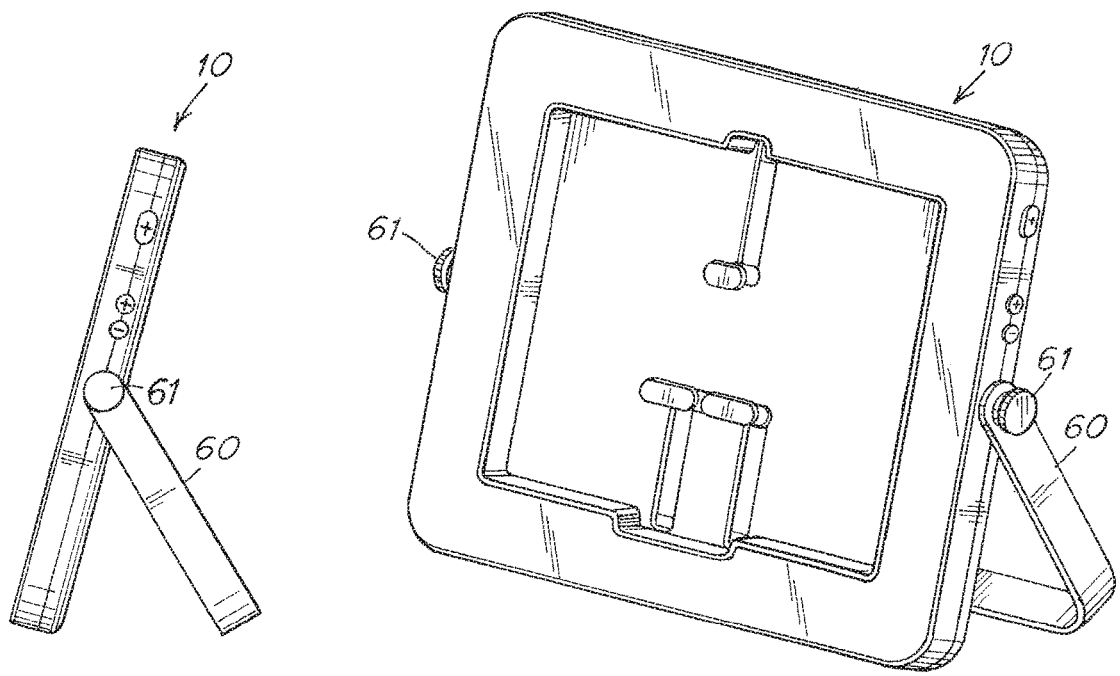

The device 10 may be provided with a tabletop stand 60 as shown in FIGS. 8A, 8B, and 8C. As shown in FIG. 8A, the tabletop stand has a shape that follows the shape of the housing 100, so that the stand can be positioned against the lower side of the housing 100 for compactness for storage or travel, or for mounting a further stand as described below. The tabletop stand 60 can be attached to the housing 100 by screws 61, screwed into screw holes 62 (refer to FIG. 3) provided at the left and right sides of the device. The tabletop stand 60 is rotatable to allow a user to position the device 10 on a surface at a desired angle. The tabletop stand 60 may be fully rotatable (i.e., through 360°) around the housing 100 of the device 10. The screws 61 may be thumbscrews operable by a user, so that the user can loosen the screws 61 to rotate the tabletop stand 60, and so that the user can tighten the screws 61 to secure the tabletop stand 60 in a desired position. Instead of or in addition to thumbscrews, the tabletop stand 60 may be provided with friction members at a point of connection with the housing 100, so that the tabletop stand 60 remains in any position to which it is moved.

Figure 9C:
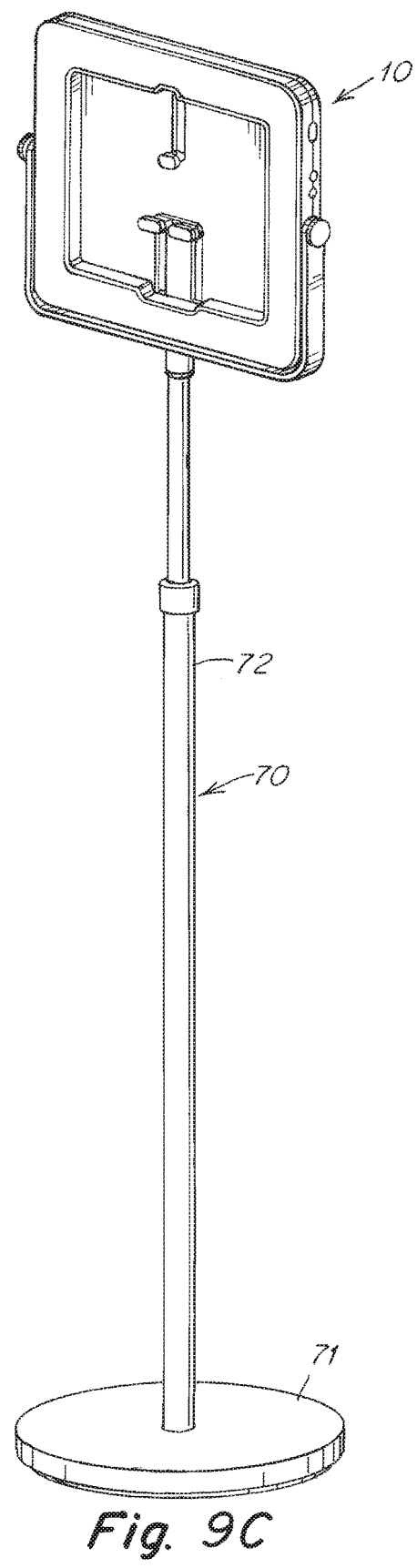

The device 10 may also be removably mountable on a floor stand 70, which includes a weighted base 71 for stability and an adjustable telescopic pole 72, which can be broken down for shipping, mounted to the weighted base 71. See FIGS. 9A, 9B, and 9C. The telescopic pole 72 allows the user to position the device 10 at a desired height (for example, 40.5 inches to 70.0 inches). The telescopic pole 72 can, for example, be attached to the tabletop stand 60 by inserting the threaded top of the telescopic pole 72 into a hole in the tabletop stand 60, and securing the telescopic pole 72 to the stand 60 with a nut 73.

Figures 10A, 10B:
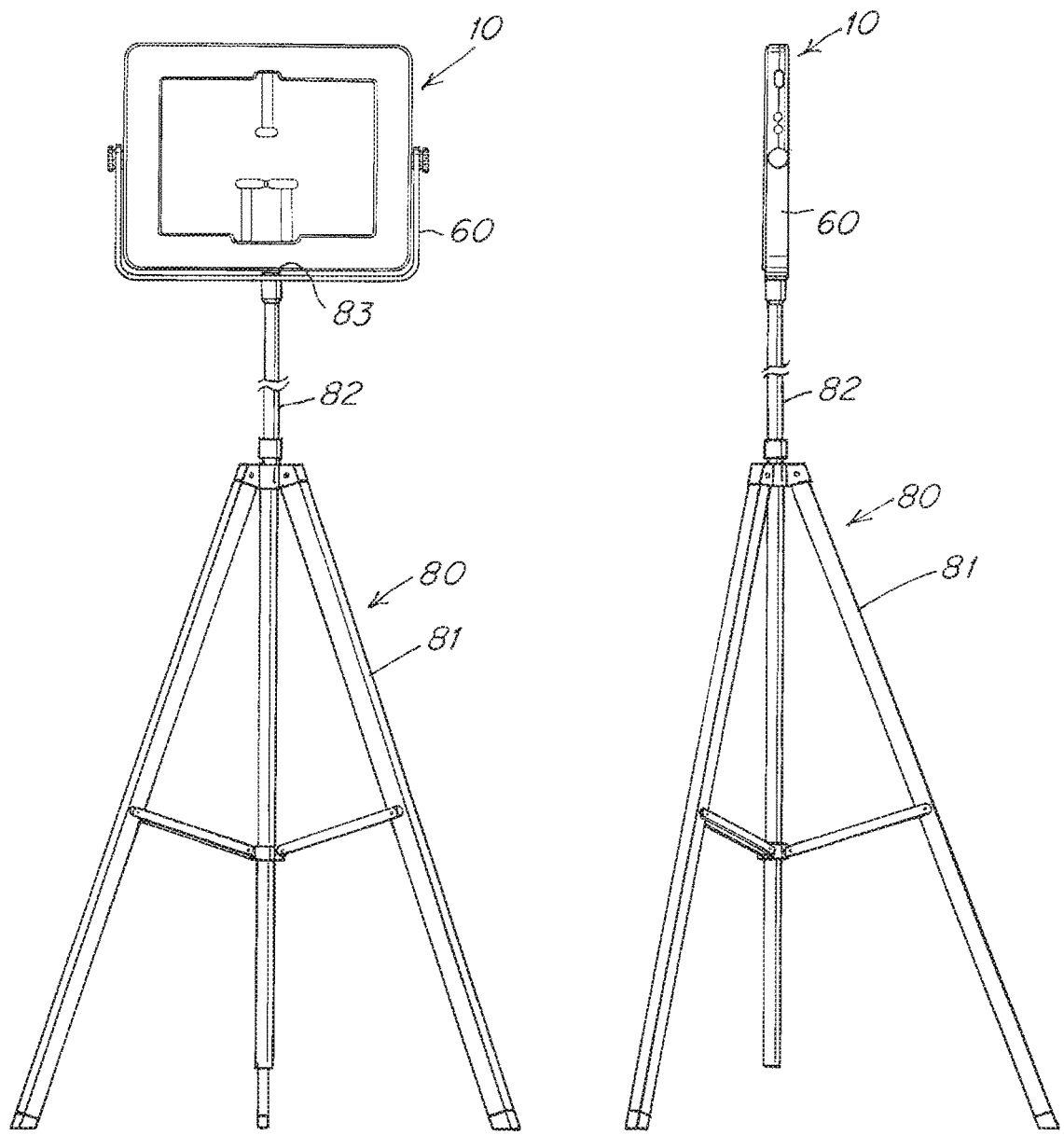
FIGS. 10A, 10B, and 10C are front, side, and perspective views, respectively, of the device mounted on a tripod stand.
Figure 10C:
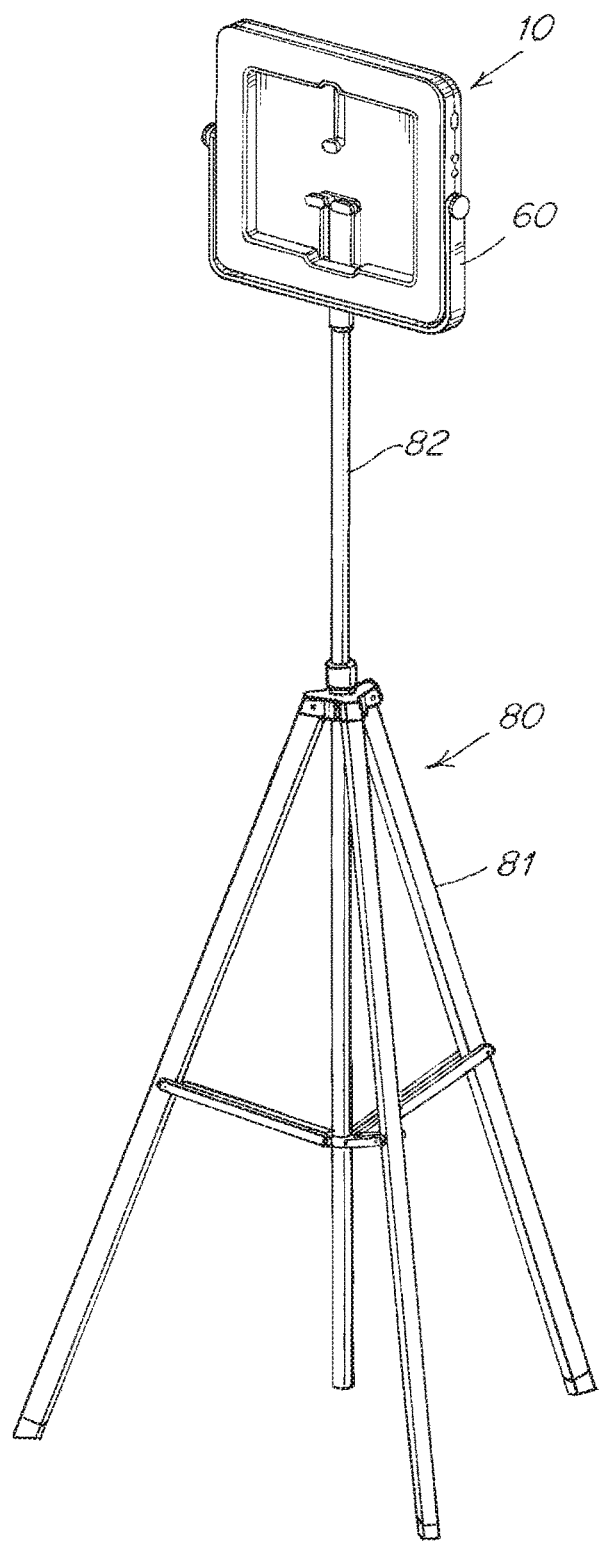

The device 10 may alternatively or additionally be removably mountable on a tripod stand 80, which includes a tripod base 81 for stability and an adjustable telescopic pole 82 mounted to the tripod base 81. See FIGS. 10A, 10B, and 10C. The telescopic pole 82 allows the user to position the device 10 at a desired height (for example, 41.6 inches to 72.0 inches). The telescopic pole 82 can, for example, be attached to the tabletop stand 60 by inserting a threaded top of the telescopic pole 82 into a hole in the tabletop stand 60, and securing the telescopic pole 82 with a nut 83.

With the structure described above, a user can place a portable electronic device such as a smartphone or tablet computer in the recess 20 such that the device is held by the adjustable upper and lower grips 41 and 42a, 42b. For example, the user mounts a smartphone to the device 10 such that the screen and front facing camera of the smartphone face outward from the recess 20. The user can then use the remote control 25 to control the camera function of the smartphone to take self-portraits ("selfies") or other photographs, without the need to hold the smartphone. Moreover, since the device 10 includes built-in illumination in the form of the illuminated (light-emitting) surface of the raised peripheral section 30, the user can properly illuminate the photographs. The device 10 could also be used, for example, as a smartphone-holder and source of illumination for video telephone calls. The device 10 can also be used for conventional hand-held selfies by connecting the device 10 to a rod or an adjustably extendable rod which is held by a user at the free end of the rod.

In the embodiment described above, the housing of the device includes a raised peripheral surface around a recessed area. However, in an alternative embodiment the recessed area is not provided, and the housing has a single level surface with the gripping mechanism provided at a central area of the surface and one or more peripheral light emitting areas at a peripheral area of the surface.

What is claimed is:

1. A device comprising:
    a housing having a front side and a rear side, wherein the front side includes a peripheral front surface, a central front surface which is recessed with respect to the peripheral front surface, and interior side walls provided at edges of the central front surface to connect the central front surface to the peripheral front surface, wherein the central front surface and the interior side walls define a recessed area, and wherein the peripheral front surface is a front surface of a raised peripheral section provided around the recessed area, the recessed area being recessed with respect to the raised peripheral section;
    a gripping mechanism provided in the recessed area, wherein the gripping mechanism projects from the central front surface and is movable along the central front surface, and wherein the gripping mechanism is adjustable to hold portable electronic devices of a plurality of different sizes; and
    a light source provided in the raised peripheral section, to emit light from the raised peripheral section.

2. The device of claim 1, wherein the front surface of the raised peripheral section is translucent.

3. The device of claim 1, wherein the raised peripheral section comprises a first translucent portion and a second translucent portion on opposite sides of the recessed area, and
    wherein the light source comprises a first light source arranged to emit light through the first translucent portion, and a second light source arranged to emit light through the second translucent portion.

4. The device of claim 3, wherein the first translucent portion and the second translucent portion comprise a translucent coating applied to an interior side of the first translucent portion and the second translucent portion.

5. The device of claim 3, wherein the raised peripheral portion is translucent only at the first translucent portion and the second translucent portion.

6. The device of claim 1, wherein the gripping mechanism includes an upper grip and a lower grip.

7. The device of claim 6, further comprising a biasing mechanism in an interior of the housing which biases the upper grip and the lower grip toward each other.

8. The device of claim 6, wherein the upper grip and the lower grip are coupled to each other by a rack and pinion mechanism provided in an interior of the housing.

9. The device of claim 1, further comprising a remote control configured to communicate wirelessly with the portable electronic devices.

10. The device of claim 1, further comprising a tabletop stand that is coupled to the housing and rotatable with respect to the housing.

11. The device of claim 10, wherein the tabletop stand is configured to be fixed with respect to the housing at an arbitrary position to which the tabletop stand has been rotated.

12. The device of claim 10, further comprising a floor stand which is configured to be coupled to the tabletop stand, the floor stand comprising a base and an adjustable pole coupled to the base.

13. The device of claim 12, wherein the base of the floor stand comprises a tripod.

14. The device of claim 12, wherein the base of the floor stand comprises a unipod.

15. The device of claim 1, further comprising an operation member which is operable to adjust a level of brightness of the light source.

16. The device of claim 1, further comprising a port provided in the recessed area which is configured to receive a power cord for charging the portable electronic devices.

17. The device of claim 1, further comprising a removable battery provided in the housing.

18. The device of claim 1, wherein the raised peripheral portion completely surrounds the recessed area.

19. The device of claim 1, wherein the central front surface comprises grooves from which the gripping mechanism projects and along which the gripping mechanism is movable.

20. The device of claim 1, wherein the central front surface is rectangular;
    wherein the peripheral front surface is a continuous surface that surrounds all four sides of the central front surface; and
    wherein the interior side walls are continuous with each other and surround all four sides of the central front surface.

* * * * *